United States Patent
Fujioka

(10) Patent No.: US 12,288,593 B2
(45) Date of Patent: Apr. 29, 2025

(54) SEMICONDUCTOR MEMORY DEVICE AND METHOD OF READING A SEMICONDUCTOR MEMORY DEVICE

(71) Applicant: Winbond Electronics Corp., Taichung (TW)

(72) Inventor: Shinya Fujioka, Yokohama (JP)

(73) Assignee: WINDBOND ELECTRONICS CORP., Taichung (TW)

( * ) Notice: Subject to any disclaimer, the term of this patent is extended or adjusted under 35 U.S.C. 154(b) by 174 days.

(21) Appl. No.: 18/178,017

(22) Filed: Mar. 3, 2023

(65) Prior Publication Data

US 2023/0335213 A1 Oct. 19, 2023

(30) Foreign Application Priority Data

Apr. 18, 2022 (JP) ................. 2022-068000

(51) Int. Cl.
  *G11C 29/44* (2006.01)
  *G11C 29/02* (2006.01)
  *G11C 29/52* (2006.01)
  *H03K 19/017* (2006.01)

(52) U.S. Cl.
  CPC ........... *G11C 29/52* (2013.01); *G11C 29/022* (2013.01); *H03K 19/01742* (2013.01)

(58) Field of Classification Search
  CPC ....... G11C 29/52; G11C 29/022; G11C 29/42; G11C 2029/0411; G11C 29/44; G11C 11/409; G11C 7/1051; G11C 7/222; G11C 29/12015; H03K 19/01742; G06F 11/1048

USPC ...................................................... 365/185.09
See application file for complete search history.

(56) References Cited

U.S. PATENT DOCUMENTS

| 8,694,873 | B2 | 4/2014 | Kim et al. | |
|---|---|---|---|---|
| 2008/0005647 | A1* | 1/2008 | Bains | G06F 11/1004 714/781 |
| 2023/0267976 | A1* | 8/2023 | Li | G11C 7/1096 |

FOREIGN PATENT DOCUMENTS

| CN | 101980339 A | 2/2011 |
|---|---|---|
| CN | 102142270 A | 8/2011 |
| CN | 107924369 A | 4/2018 |
| CN | 108281162 A | 7/2018 |
| TW | 382705 B | 2/2000 |

* cited by examiner

*Primary Examiner* — Huan Hoang
(74) *Attorney, Agent, or Firm* — Birch, Stewart, Kolasch & Birch, LLP

(57) ABSTRACT

A semiconductor memory device that can easily recognize the content of errors in data is provided. The semiconductor memory device includes a memory cell array, an error detection and correction circuit, and an input/output circuit. The memory cell array includes a plurality of memory cells. The error detection and correction circuit detects and corrects error bits included in the data output by the memory cell array. The error detection and correction circuit activates an error detection signal when the data includes a correctable error bit. The input/output circuit stops the clocking of the data strobe signal output with data when the data includes uncorrectable error bits.

20 Claims, 7 Drawing Sheets

SEMICONDUCTOR MEMORY DEVICE AND METHOD OF READING A SEMICONDUCTOR MEMORY DEVICE

CROSS REFERENCE TO RELATED APPLICATIONS

This Application claims priority of Japanese Patent Application No. 2022-068000, filed on Apr. 18, 2022, the entirety of which is incorporated by reference herein.

BACKGROUND OF THE INVENTION

Field of the Invention

The present invention relates to a semiconductor memory device, and, in particular, to a semiconductor memory device capable of error detection and correction.

Description of the Related Art

Among conventional semiconductor memory devices, some are capable of detecting and correcting errors, such as Error Correcting Code (ECC), when output data responding to a read command input from an external device (e.g., a memory controller) includes an error bit. For example, a HyperRAM™ product with model number IS67WVH16M8EDALL published by ISSI makes ERR signals that indicate ECC events are valid when external output data includes an error.

However, for external devices, it is impossible to know information other than there is an error according to a valid ERR signal. In other words, for external devices, it is difficult to know the specific content of an error (for example, whether a correctable number (e.g., 1 bit) of error bits is detected, or whether an uncorrectable number (e.g., more than 2 bits) of error bits is detected).

BRIEF SUMMARY OF THE INVENTION

In view of the above problem, the present invention is made to provide a semiconductor memory device that can easily identify the specific content of an error in output data.

To solve the above problem, an embodiment of the present invention provides a semiconductor memory device, comprising: a memory cell array, an error detection and correction circuit, and an input/output circuit. The memory cell array comprises a plurality of memory cells. The error detection and correction circuit detects is coupled to the memory cell array, and is configured to detect error bits in data output from the memory cell array and make an error detection signal valid and correcting a correctable error bit when the data includes the correctable error bit, wherein the error detection signal indicates that the correctable error bit is detected. The input/output circuit is coupled to the error detection and correction circuit, and is configured to receive the data or the corrected data and the error detection signal from the error detection and correction circuit and to output a data strobe signal, the data or the corrected data, and the error detection signal. The data strobe signal includes a plurality of pulses in response to clock signals when the data includes the correctable error bit, and the input/output circuit stops generating at least one of the pulses of the data strobe signal when the data includes an uncorrectable bit. The bit number of the uncorrectable bit is larger than the bit number of the error bit that can be corrected by the error detection and correction circuit.

According to an embodiment of the present invention, by making the error detection signal valid and the data strobe signal with pulses in response to clock signals, an external device can know that the output data includes the correctable error bit, by stopping the pulse of the data strobe signal, the external device can know that there is an uncorrectable bit exists in the output data. Therefore, the distinct content of errors in the output data can be easily identified based on the error detection signal and the data strobe signal.

DETAILED DESCRIPTION OF THE INVENTION

The semiconductor memory devices according to embodiments of the present invention will be described in detail below with reference to the attached drawings. The embodiments are merely examples, and the present invention is not limited to them.

In addition, the notations such as "first", "second", and "third" herein are used to distinguish a certain component from other components, and is not intended to limit the number, order, priority, etc. of the element.

Figure 1:
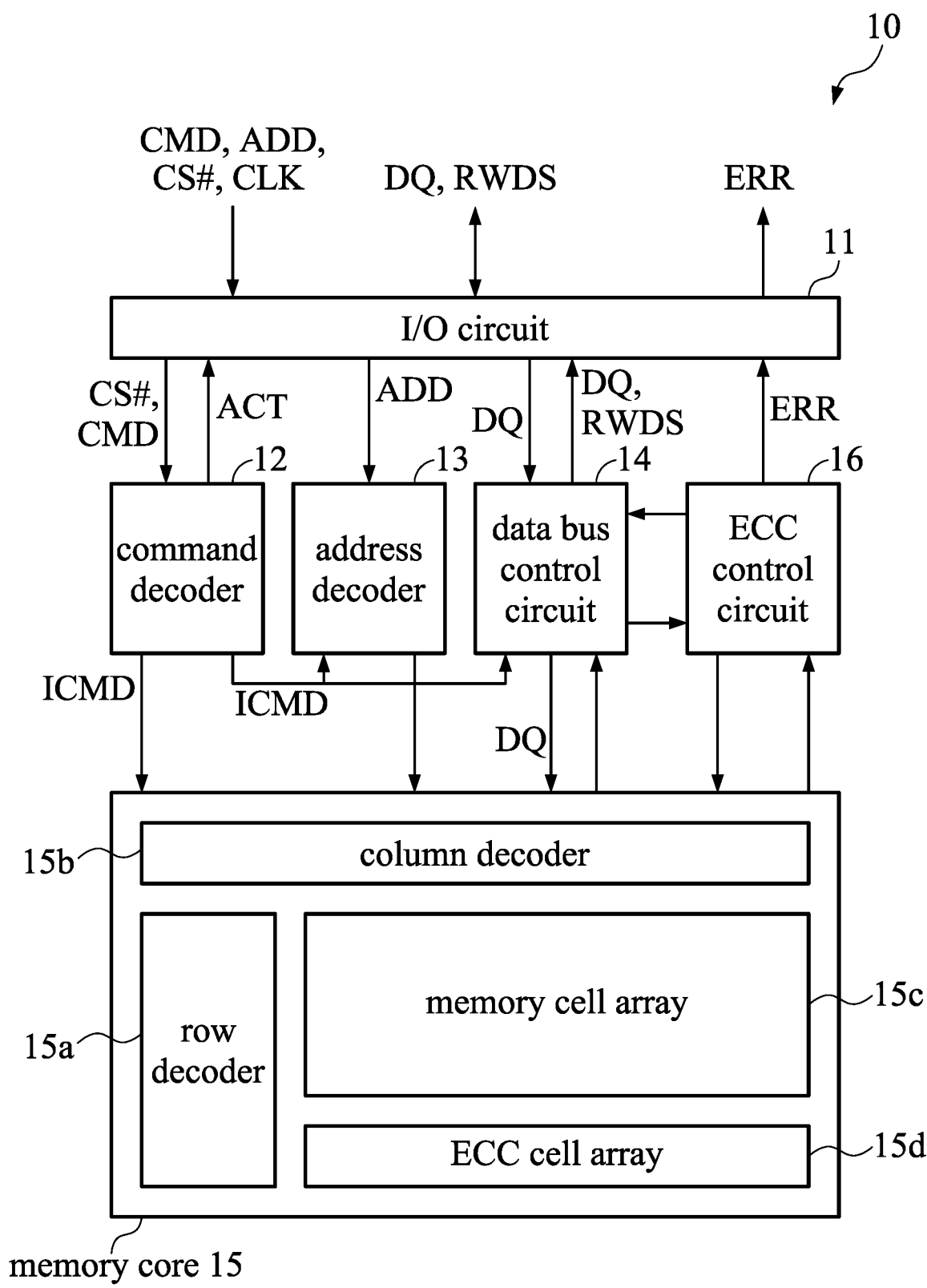
FIG. 1 is a block diagram showing a configuration example of a semiconductor memory device according to a first embodiment of the present invention.

As shown in FIG. 1, the semiconductor memory device 10 of the present embodiment includes: more than one semiconductor chips including an input and output (I/O) circuit 11, a command decoder 12, an address decoder 13, a data bus control circuit 14, a memory core 15, and an ECC control circuit 16. Each element in the semiconductor memory device 10 can be configured by a dedicated hardware device or logic gate circuit. It should be noted that well-known configurations such as a power supply circuit, for example, are not shown in this embodiment for simplicity.

The semiconductor memory device 10 according to the present embodiment can be any semiconductor memory device capable of an error detection and correction function for internally stored data. For example, it can be DRAM (Dynamic Random Access Memory), pSRAM (pseudo-Static Random Access Memory), SRAM (Static Random Access Memory), flash memory, and so on. Here, a case where the semiconductor memory device 10 is a pSRAM will be described as an example. The pSRAM uses DRAM to store data as a memory cell array, and has an interface compatible with SRAM (Static Random Access Memory). In addition, the pSRAM adopts DDR (Double Data Rate) as a data transfer method, and is capable of using an expanded serial peripheral interface (xSPI) and a HyperBus™ interface or an Xccela™ interface as an access interface.

The I/O circuit 11 is configured to transmit and receive signals between an external device (for example, a memory controller, etc.) and a memory core 15. Specifically, in the present embodiment, the I/O circuit 11 outputs an active-low (negative logic) chip selection signal CS #, or a command signal CMD, etc., which is input from the external device to the command decoder 12. The I/O circuit 11 outputs the external clock signal CLK which is input from the external device to a clock generator (not shown in the figure) for generating the internal clock signal CLKI (shown in FIG. 2) based on the external clock signal CLK. The I/O circuit 11 outputs an address signal ADD which is input from the external device to the address decoder 13. The I/O circuit 11 outputs a data signal DQ (hereinafter referred to as "data DQ") which is input from the external device to the data bus control circuit 14, and outputs the data DQ which is output from the data bus control circuit 14 to the external device. The I/O circuit 11 outputs the data DQ to be output to the external device together with the data strobe signal RWDS to the external device. The I/O circuit 11 outputs an error detection signal ERR which is output from the ECC control circuit 16 to the external device.

The command decoder 12 is configured to generate an active-high (positive logic) active signal ACT based on the chip selection signal CS #, and to decode the command signal CMD to generate an inner command signal ICMD. For example, the internal commands ICMD generated by the command decoder 12 include read signal, write signal, precharge signal, refresh signal, and so on. Further, when the semiconductor memory device 10 is a pSRAM, the command decoder 12 can generate the refresh signal at a predetermined timing automatically regardless of whether the command CMD is input from the external device. In addition, when the command decoder 12 generates the refresh signal as the internal command ICMD, the command decoder 12 outputs the address signal of the memory cell to be refreshed to the address decoder 13.

The command decoder 12 can output the generated active signal ACT to the second control circuit 11b of the I/O circuit 11. The command decoder 12 can output the generated internal command ICMD to the address decoder 13 and the data bus control circuit 14 to control the address decoder 13 and the data bus control circuit 14 based on the internal command.

The address decoder 13 is configured to decode an address signal (for example, the address signal ADD input from the external device via the I/O circuit 11, or the address signal of the memory cell to be refreshed which is input from the command decoder 12, and so on) to generate a row address signal used to select a word line and a column address signal used to select a bit line, and output the row address signal and the column address signal to a row decoder 15a and a column decoder 15b of the memory core 15, respectively.

The data bus control circuit 14 outputs the data DQ which is input from the external device via the I/O circuit 11 to the sense amplifier (not shown) of the memory core 15 and the ECC control circuit 16. Alternatively, the data bus control circuit 14 outputs data DQ which is output from the sense amplifier (not shown) of the memory core 15 or the ECC control circuit 16 to the I/O circuit 11.

The memory core 15 can include a row decoder 15a, a column decoder 15b, a memory cell array 15c, an ECC cell array 15d, and a sense amplifier.

The memory cell array 15c includes multiple memory cells (not shown in the figure) arranged in an array. Data externally input via the I/O circuit 11 is stored in a memory cell that is selected by the command signal CMD. Each memory cell may be a well-known 1-transistor 1-capacitor type memory cell, or it may be a well-known 2-transistor 2-capacitor type memory cell. Besides, each memory cell is connected to one of the multiple word lines and one of the multiple bit lines. Furthermore, each of the multiple word lines are connected to the row decoder 15a, and each of the multiple bit lines are connected to the column decoder 15b and the sense amplifier.

The configuration of the ECC cell array 15d is similar to the memory cell array 15c. Therefore, repeated descriptions are omitted. Here, the memory capacity of the ECC cell array 15d can be the same as or different from that of the memory cell array 15c. In addition, the ECC cell array 15d can store check data (parity data) for all data corresponding to the memory cell array 15c, or it can only store check data for part of the data corresponding to the memory cell array 15c.

Furthermore, since data control for each memory cell of the row decoder 15a, column decoder 15b, memory cell array 15c and the ECC cell array 15d are the same as the well-known technique, description thereof will be omitted in the present embodiment.

The ECC control circuit 16 generates an error correction code for data output (stored) from the data bus control circuit 14 to the memory cell array 15c, and stores the check data (parity data) in the generated error correction code in the ECC cell array 15d. In response to the read signal input from the command decoder 12, the ECC control circuit 16 uses the check data stored in the ECC cell array 15d to detect and correct the error bit included in the data output (read) from the memory cell array 15c. The ECC control circuit 16 then outputs the error detected and corrected data to the data bus control circuit 14. When the data output from the memory cell array 15c includes a correctable error bit, the ECC control circuit 16 makes the error detection signal ERR that indicates a correctable error bit is detected valid (high-level) and outputs it to the I/O circuit 11. The ECC control circuit 16 is an example of the "error detection/correction circuit" in the present invention.

Figure 2:
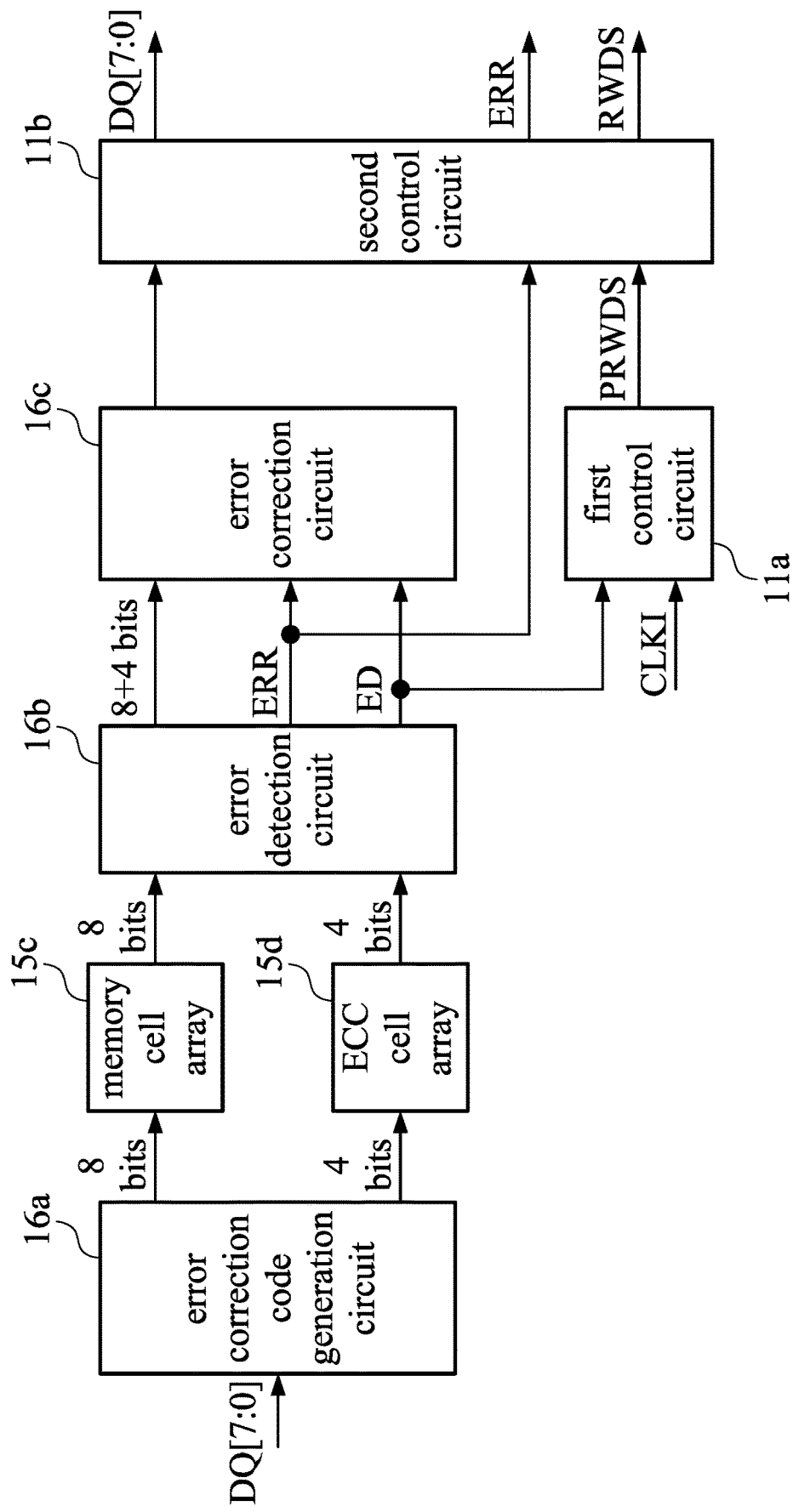
FIG. 2 is a diagram illustrating an example of data control in the semiconductor memory device of the present embodiment.

In the present embodiment, as shown in FIG. 2, the ECC control circuit 16 includes an error correction code generation circuit 16a that generates an error correction code (encoded data) for data stored in the memory cell array 15c; an error detection circuit 16b that detects error bits contained in the data when the data generating the error correction code is read from the memory cell array; and an error correction circuit 16c that corrects a correctable error bit when the error detection circuit 16b detects the correctable error bit.

Here, the process of generating error correction code and the process of detecting and correcting error bit can be performed by a well-known method using Hamming code or Bose-Chaudhuri-Hocquenghem (BCH) code, and so on. In the present embodiment, when one error bit exists in data DQ, the error bit can be detected and corrected by the ECC control circuit 16. However, if two or more error bits are contained in data DQ, the ECC control circuit 16 cannot correct the error bits.

The case where data is stored (written) in the memory cell array 15c will be described below. As shown in FIG. 2, after 8-bit data DQ [7:0] is input from the data bus control circuit 14 to the ECC control circuit 16, the error correction code generation circuit 16a generates an error correction code (encoded data) for the data DQ [7:0], and stores 4-bit check data (parity data) in the generated error correction code in the ECC cell array 15*d*. Here, the error correction code generation circuit 16*a* can store the data DQ [7:0] in the generated error correction code in the memory cell array 15*c*, or control the data bus control circuit 14 to store the data DQ [7:0] in the memory cell array 15*c*. Noted that the length of data DQ that is the source of the encoded data and the length of the check data can be designed by need, and the present invention is not limited by the embodiments.

Next, the case where data DQ [7:0] is output (read) from the memory cell array 15*c* will be described. In the present embodiment, I/O circuit 11 includes a first control circuit 11*a* and a second control circuit 11*b*. After 8-bit data DQ[7:0] is output from the memory cell array 15*c*, the error detection circuit 16*b* of the ECC control circuit 16 acquires check data that corresponds to the output data DQ[7:0] from the memory cell array 15*c*, and using the acquired check data to detect error bits contained in output data DQ[7:0]. Here, data DQ[7:0] output from the memory cell array 15*c* can be output to the error detection circuit 16*b* via the data bus control circuit 14. The error detection circuit 16*b* outputs the data DQ [7:0] including error bits been detected and the check data corresponding to the data DQ [7:0] to the error correction circuit 16*c*.

Here, the error detection circuit 16*b* of the ECC control circuit 16 makes the error detection signal ERR be valid (high-level) when the number of error bits in data DQ [7:0] is a correctable number (for example, 1), and outputs the valid error detection signal ERR to the error correction circuit 16*c* and the second control circuit 11*b* of the I/O circuit 11.

In the present embodiment, when correctable error bits exist in data DQ[7:0], the error detection circuit 16*b* makes the error detection signal ERR be valid (high-level) until the read operation of the data sequence including data DQ[7:0] is completed (for example, since the chip selection signal CS # turns valid (low-level) until it becomes invalid (high-level)). Thus, data DQ [7:0] including correctable error bits in the data sequence can be easily recognized (by the external device).

If data DQ [7:0] contains an uncorrectable number (for example, two or more) of error bits (referred to as uncorrectable bits), the error detection circuit 16*b* turns a detection signal ED indicating uncorrectable bits have been detected to be valid (high-level) and outputs it to the error correction circuit 16*c* and the first control circuit 11*a* of the I/O circuit 11.

In this embodiment, the error detection circuit 16*b* makes the detection signal ED become valid (high-level) until the read operation of the data sequence including data DQ[7:0] completes when data DQ[7:0] contains uncorrectable bits.

In the present embodiment, the error correction circuit 16*c* uses the check data input from the error detection circuit 16*b* to correct the data DQ[7:0] input from the error detection circuit 16*b* when the error detection signal ERR becomes valid. The error correction circuit 16*c* then outputs the corrected data DQ [7:0] to the second control circuit 11*b* of the I/O circuit 11. Furthermore, when the detection signal ED becomes valid, the error correction circuit 16*c* outputs the data DQ [7:0] including uncorrectable bits which is input from the error detection circuit 16*b* to the second control circuit 11*b* without performing correction process.

When the detection signal ED becomes invalid (low-level) (i.e. the data DQ[7:0] does not contain uncorrectable bits), the first control circuit 11*a* of the I/O circuit 11 generates a pre data strobe signal PRWDS, which corresponds to the data strobe signal RWDS and is toggled in response to the internal clock signal CLKI, and outputs the pre data strobe signal PRWDS to the I/O circuit 11 of the second control circuit 11*b*. In addition, when the detection signal ED becomes valid (high-level) (i.e. data DQ [7:0] contains uncorrectable bits), the first control circuit 11*a* stops the pulse (clocking) of the pre data strobe signal PRWDS (i.e. stops outputting the toggled pre data strobe signal PRWDS).

Note that in the present embodiment, the first control circuit 11*a* of the I/O circuit 11 stops generating pre data strobe signal PRWDS when data DQ[7:0] includes uncorrectable bits (i.e. the detection signal ED becomes valid) until the read operation of the data sequence including data DQ[7:0] is completed. Accordingly, during the same period, the second control circuit 11*b* of the I/O circuit 11 stops generating the toggled data strobe signal RWDS, therefore, data sequence including the data DQ[7:0] that contains uncorrectable bits can be easily identified (by the external device).

When the semiconductor chip including the memory cell array 15*c*, the ECC control circuit 16 (error detection/correction circuit), and the first control circuit 11*a* is selected (i.e. the chip selection signal CS # becomes valid), the second control circuit 11*b* of the I/O circuit 11 outputs the input data DQ[7:0] to a data terminal (not shown in the figure), outputs the input error detection signal ERR to an ERR output terminal (not shown in the figure), and outputs the input pre data strobe signal PRWDS to a data strobe terminal (not shown in the figure) as a data strobe signal RWDS. In this manner, the data DQ [7:0], the error detection signal ERR and the data strobe signal RWDS can be output to the external device through respective terminals.

In addition, when the semiconductor chip including the memory cell array 15*c*, the ECC control circuit 16 (error detection/correction circuit), and the first control circuit 11*a* is not selected (i.e. the chip selection signal CS # becomes invalid), the second control circuit 11*b* of the I/O circuit 11 is configured to set at least one of the error detection signal ERR, the data DQ[7:0], and the data strobe signal RWDS to be the high-impedance state.

Figure 3:
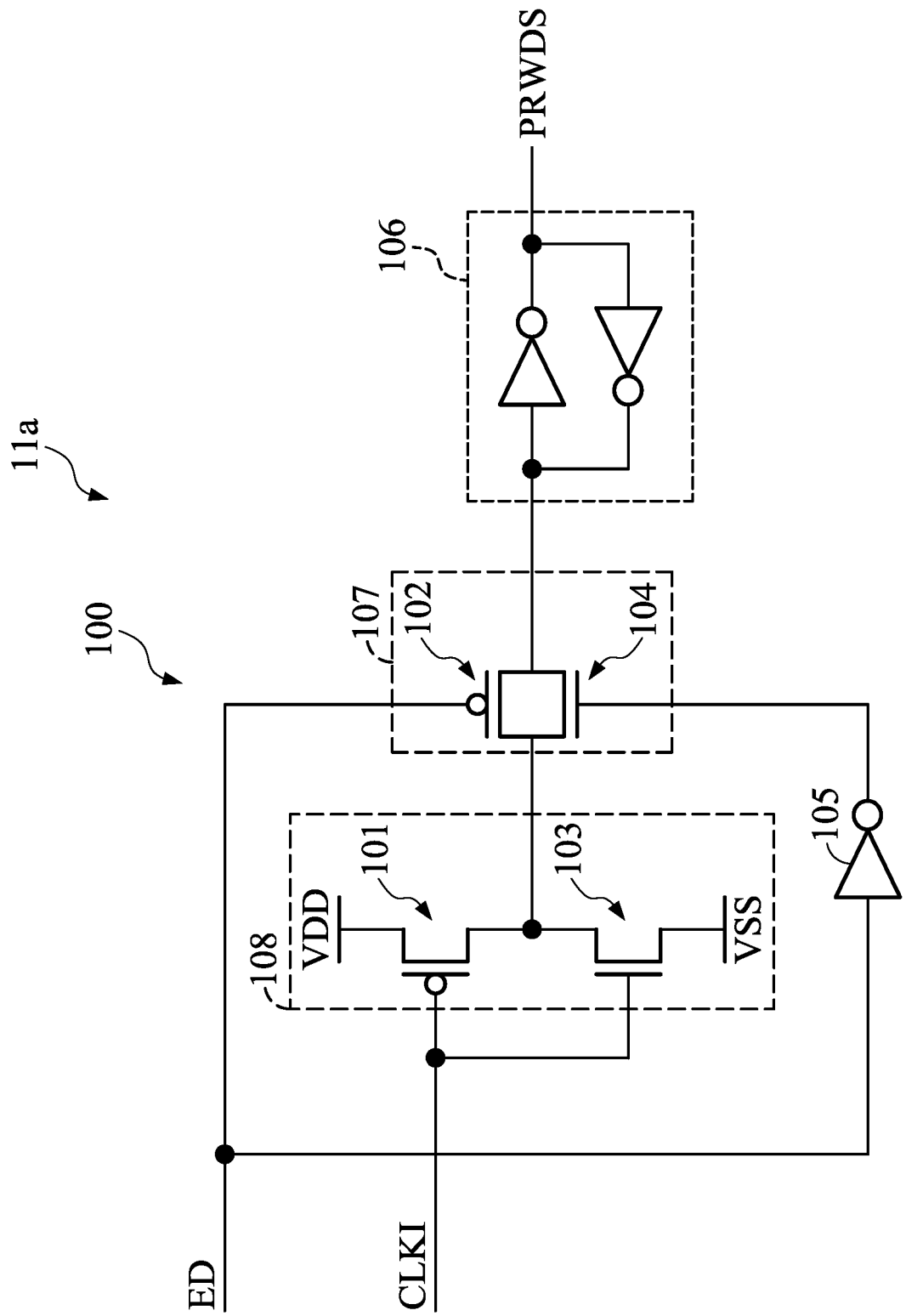
FIG. 3 shows a diagram of a configuration example of a first control circuit.

FIG. 3 illustrates the configuration of the first control circuit 11*a* of the I/O circuit 11. The first control circuit 11*a* includes a RWDS driver 100 which is configured to generate a pre data strobe signal PRWDS corresponding to the data strobe signal RWDS based on the clock signal (internal clock signal CLKI herein). In the present embodiment, RWDS driver 100 includes a logic gate circuit 108, a switching circuit 107, an inverter 105, and a latch circuit 106. The logic gate circuit 108 is configured to generate a toggled pulse in response to the clock signal based on the internal clock signal CLKI. The switching circuit 107 is coupled between the logic gate circuit 108 and the latch circuit 106, and is configured to be controlled to an on-state or an off-state according to the detection signal ED to determine whether to provide the output of the logic gate circuit 108 to the latch circuit 106. The inverter 105 is configured to generate a logical inverse signal of the detection signal ED and to provide the logical inverse signal of the detection signal ED to the switching circuit 107.

The logic gate circuit 108 includes a P-Channel MOSFET 101 and an N-Channel MOSFET 103 connected in series between the high-voltage power supply VDD and the low-voltage power supply VSS. The switching circuit 107 consists of MOSFET 102 and MOSFET 104 is connected to a connection node between the MOSFET 101 and MOSFET 103. The output of the switching circuit 107 is connected to the latch circuit 106, and the output signal of the latch circuit 106 is output as the pre data strobe signal PRWDS from the RWDS driver 100.

The detection signal ED output from the error detection circuit 16b of the ECC control circuit 16 is input to the gate of the MOSFET 102, and the logical inverse signal of the detection signal ED generated by the inverter 105 is input to the gate of the MOSFET 104. The clock signal (internal clock signal CLKI) is input to each of the gates of the MOSFET 101 and the MOSFET 103.

The RWDS driver 100 based on the present embodiment makes the latch circuit 106 outputs the pulse of the toggled pre data strobe signal PRWDS responding to the clock signal (internal clock signal CLKI) in response to the detection signal ED becoming invalid (low-level) and the switching circuit 107 becoming on-state. On the other hand, in response to the detection signal ED becoming valid (high-level) and the switching circuit 107 becoming off-state, the latch circuit 106 is enabled to retain the prior cycle of the pre data strobe signal PRWDS which has been held in the latch and stops the pulse of the pre data strobe signal PRWDS.

Figure 4:
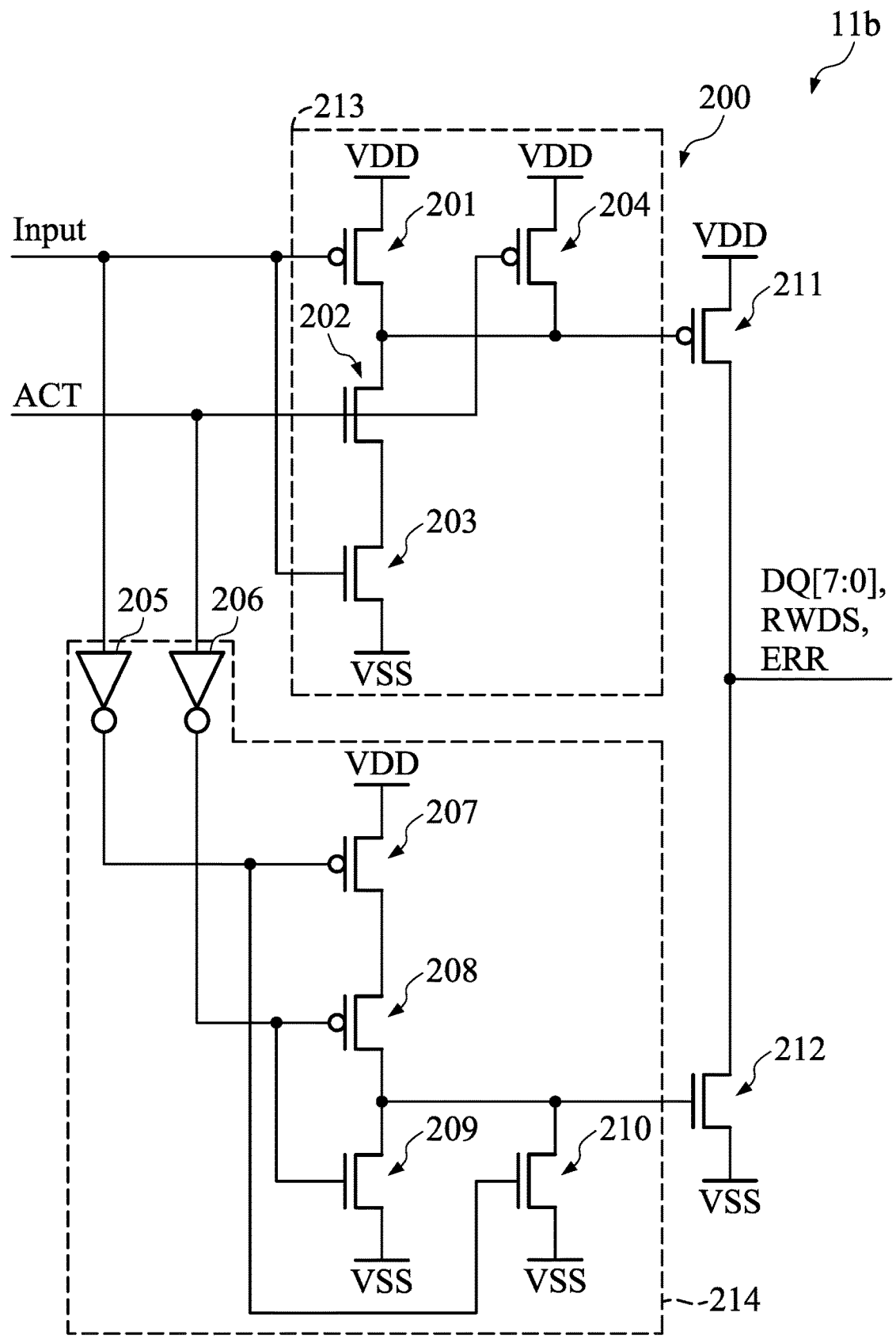
FIG. 4 shows a diagram of a configuration example of a second control circuit.
Figure 5:
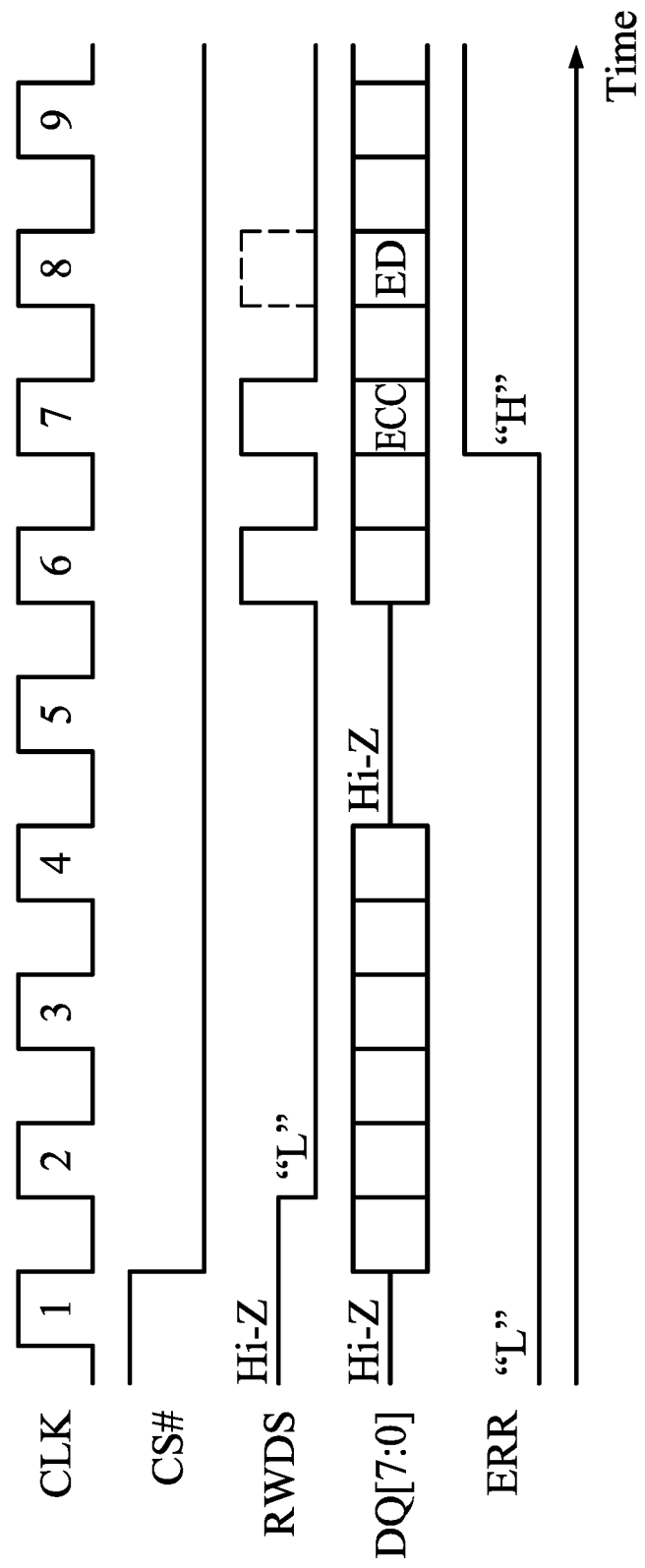
FIG. 5 shows a time chart of a read operation of the semiconductor memory device of the first embodiment of the present invention.

Referring to FIG. 4, the configuration of the second control circuit 11b of the I/O circuit 11 is illustrated. The second control circuit 11b comprises an off-chip driver 200. The off-chip driver 200 comprises a pull-up circuit 211, a pull-down circuit 212, a pull-up control circuit 213, and a pull-down control circuit 214. The pull-up control circuit 213 is configured to generate a first gate control signal for controlling the pull-up circuit 211 based on the input signal Input (the data DQ[7:0], the pre data strobe signal PRWDS, or the error detection signal ERR herein) and the activation signal ACT. The pull-down control circuit 214 is configured to generate a second gate control signal for controlling the pull-down circuit 212 based on the logical inverse signals of the input signal Input and the activation signal ACT.

In the present embodiment, the pull-up control circuit 213 includes a P-Channel MOSFET 201, N-Channel MOSFETs 202, and 203 and a P-Channel MOSFET 204. The pull-down control circuit 214 includes inverters 205, and 206, P-Channel MOSFETs 207, and 208, N-Channel MOSFETs 202, and 203 and N-Channel MOSFETs 209, and 210. The pull-on circuit 211 includes a P-Channel MOSFET, and the pull-down circuit 212 includes an N-Channel MOSFET.

The MOSFETs 201, 202 and 203 are connected in series between the high-voltage power supply VDD and the low-voltage power supply VSS. The connection node between MOSFETs 201 and 202 connects the drain of the MOSFET 204 and the gate of the P-Channel MOSFET of the pull-on circuit 211. Furthermore, the source of the MOSFET 204 is connected to the high-voltage power supply VDD.

The input signal Input is input to each of the gates of MOSFETs 201, and 203. The activation signal ACT is input to each of the gates of MOSFETs 202, and 204.

The MOSFETs 207, 208 and 209 are connected in series between the high-voltage power supply VDD and the low-voltage power supply VSS. A connection node between MOSFETs 208 and 209 connects the drain of the MOSFET 210 and the gate of the N-Channel MOSFET of the pull-down circuit 212. Besides, the source of the MOSFET 210 is connected to the low-voltage power supply VSS.

A logical inverse signal of the input signal Input, which is logically inverted by the inverter 205, is input to each of the gates of the MOSFETs 207 and 210. In addition, a logical inverse signal of the active ACT, which is logically inverted by the inverter 206, is input to each of the gates of the MOSFETs 208 and 209.

The P-Channel MOSFET of the pull-on circuit 211 and the N-Channel MOSFET of the pull-down circuit 212 are connected in series between the high-voltage power supply VDD and the low-voltage power supply VSS. Besides, the signal at the connection node between the P-Channel MOSFET of the pull-on circuit 211 and the N-Channel MOSFET of the pull-down circuit 212 is output from the off-chip driver 200 as an output signal (the data DQ[7:0], data strobe signal RWDS, or the error detection signal ERR herein).

The off-chip driver 200 configured in this way outputs either the high-voltage power supply VDD or the low-voltage power supply VSS based on the logical output of the input signal Input. For example, when the activation signal ACT is at high level and the input signal Input is at high level, the P-Channel MOSFET of the pull-on circuit 211 is turned on and the N-Channel MOSFET of the pull-down circuit 212 is turned off. In this way, the off-chip driver 200 outputs a high level (high-voltage power supply VDD). Besides, when the activation signal ACT is at high level and the input signal Input is at low level, the P-Channel MOSFET of the pull-on circuit 211 is turned off and the N-Channel MOSFET of the pull-down circuit 212 is turned on. In this way, the off-chip driver 200 outputs a low level (low-voltage power supply VSS).

On the other hand, when the activation signal ACT is at low level, each of the P-Channel MOSFET of the pull-on circuit 211 and the N-Channel MOSFET of the pull-down circuit 212 is turned off. In other words, the high-voltage power supply VDD and the low-voltage power supply VSS are each disconnected (high impedance state) from the output of the off-chip driver 200 in this case. As a result, the signal output from the off-chip driver 200 (the data DQ[7:0], data strobe signal RWDS, or the error detection signal ERR herein) is set to a high impedance state.

Next, in the present embodiment, when the semiconductor chip is not selected (when the chip selection signal CS # is invalid (high level)) in the read operation of the semiconductor memory device 10, the data strobe signal RWDS, the data DQ[7:0], or the error detection signal ERR (data strobe signal RWDS and data DQ[7:0] in the example shown in the figure) enters a high impedance state (Hi-Z). In the present embodiment, for example, the chip selection signal CS # becomes valid at the falling edge of the first clock of the external clock signal CLK, and a command (a read command herein) and an address are input to the semiconductor memory device 10 during a period since the falling edge of the first clock of the external clock signal CLK until the falling edge of the fourth clock of the external clock signal CLK.

In the example shown in the figure, the I/O circuit 11 generates a pulse of the data strobe signal RWDS in response to the rising edge of each clock after the sixth clock of the external clock signal CLK, and outputs data DQ[7:0] at the rising edge and the falling edge of each clocks. At the rising edge of the seventh clock of the external clock signal CLK, the error detection circuit 16b detects that the data DQ[7:0] includes a correctable error bit (shown as ECC in the figure), and outputs the error detection signal ERR that becomes valid ("H"). In the present embodiment, since the error detection signal ERR becomes valid until the read operation is completed, the error detection signal ERR maintains valid. Furthermore, in the present embodiment, at the rising edge of the eighth clock of the external clock signal CLK, the error detection circuit 16b detects that data DQ [7:0] includes a correctable error bit, and outputs the detection signal ED that becomes valid to the first control circuit 11a, thereby enabling the second control circuit 16b to stop the pulse of the data strobe signal RWDS. In the present embodiment, the second control circuit 11b stops the pulse of the data strobe signal RWDS since the detection signal ED becomes valid until the read operation is completed.

According to the present embodiment, data including uncorrectable bits in a data sequence can be easily identified. Furthermore, data including a correctable error bit in a data sequence can be easily identified.

Figure 6:
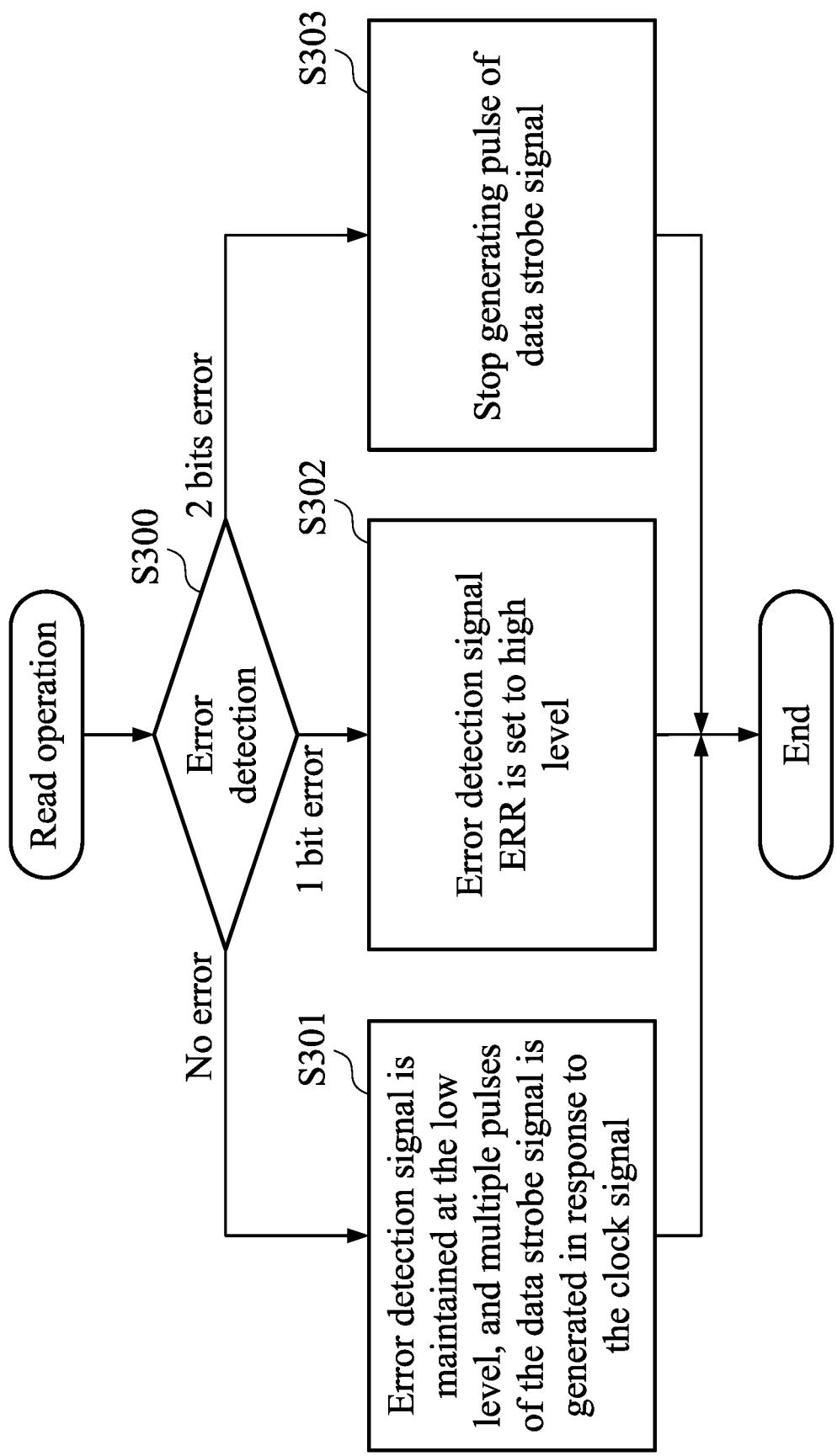
FIG. 6 shows a flow chart of the method for reading the semiconductor memory device of the present embodiment.

Referring to FIG. 6, processes of a method for reading the semiconductor memory device 10 in this embodiment will be illustrated.

First, the semiconductor memory device 10 examines whether there is an error in the data output from the memory cell array 15c (step S300). Specifically, the error detection circuit 16b of the ECC control circuit 16 uses the check data stored in the ECC cell array 15d to determine whether the data output from the memory cell array 15c contains an error bit.

When it is determined that no error exists in step S300, the error detection signal ERR is maintained at the low level, and multiple pulses of the data strobe signal RWDS is generated during a period that data is output in response to the clock signal (step S301). Specifically, the error detection circuit 16b of the ECC control circuit 16 makes the error detection signal ERR be invalid (low level) and outputs it to the error correction circuit 16c of the ECC control circuit 16 and the second control circuit 11b of the I/O circuit 11.

When it is examined that the data output from the memory cell array 15c contains errors and the number of the error bits (1 herein) is a correctable number in step S300, the error detection signal ERR is set to the high level (step S302). Specifically, the error detection circuit 16b of the ECC control circuit 16 makes the error detection signal ERR become valid (high level), and outputs it to the error correction circuit 16c of the ECC control circuit 16 and the second control circuit 11b of the I/O circuit 11. Noted that error bits are corrected by the error correction circuit 16c of the ECC control circuit 16.

When it is examined that the data output from the memory cell array 15c contains errors and the number of the error bits (2 or more herein) is an uncorrectable number in step S300, the generation of the pulse of the data strobe signal RWDS is stopped. Specifically, by the first control circuit 11a of the I/O circuit 11 stopping the pulse of the pre data strobe signal PRWDS corresponding to the data strobe signal RWDS, the second control circuit 11b stops the pulse of the data strobe signal RWDS.

As described above, according to the semiconductor memory device 10 of the present embodiment, when the data DQ[7:0] output from the memory cell array 15c contains a correctable error bit, the error detection signal ERR becomes valid. When data DQ [7:0] contains uncorrectable bits, the pulse of the data strobe signal RWDS is stopped. In this way, by making the error detection signal ERR valid, not only is it possible to identify that the correctable error bits are included in the output data DQ[7:0], but it is also possible to recognize that the uncorrectable bits are contained in the output data DQ[7:0] by stopping the pulse of the data strobe signal RWDS. Therefore, the specific content of the error in the output data DQ [7:0] can be easily identified based on the error detection signal ERR and the data strobe signal RWDS.

Furthermore, in the present embodiment, when the semiconductor chip including the second control circuit 11b, the memory cell array 15c, the ECC control circuit 16 (error detection/correction circuit), and the first control circuit 11a is not selected, at least the error detection signal ERR, the data DQ [7:0], or the data strobe signal RWDS output from the semiconductor chip is set to a high impedance state (Hi-Z). In this way, for example, even when a plurality of semiconductor chips connected to a common signal bus are provided in the semiconductor memory device 10, it is possible to suppress collision of signals (at least one of the error detection signal ERR, data DQ [7:0], and data strobe signal RWDS) output from each of the semiconductor chips on a common signal bus.

A second embodiment of the present invention will be described below. The differences between the present embodiment and the first embodiment are described below. In the present embodiment, when the data DQ[7:0] output from the memory cell array 15c contains a correctable error bit, the semiconductor memory device 10 makes the error detection signal ERR valid only while data DQ[7:0] is being output. Furthermore, when the data DQ[7:0] output from the memory cell array 15c contains an uncorrectable bit, the pulse of the data strobe signal RWDS is stopped only while the data DQ[7:0] is being output. Differences from the first embodiment will be described below.

Figure 7:
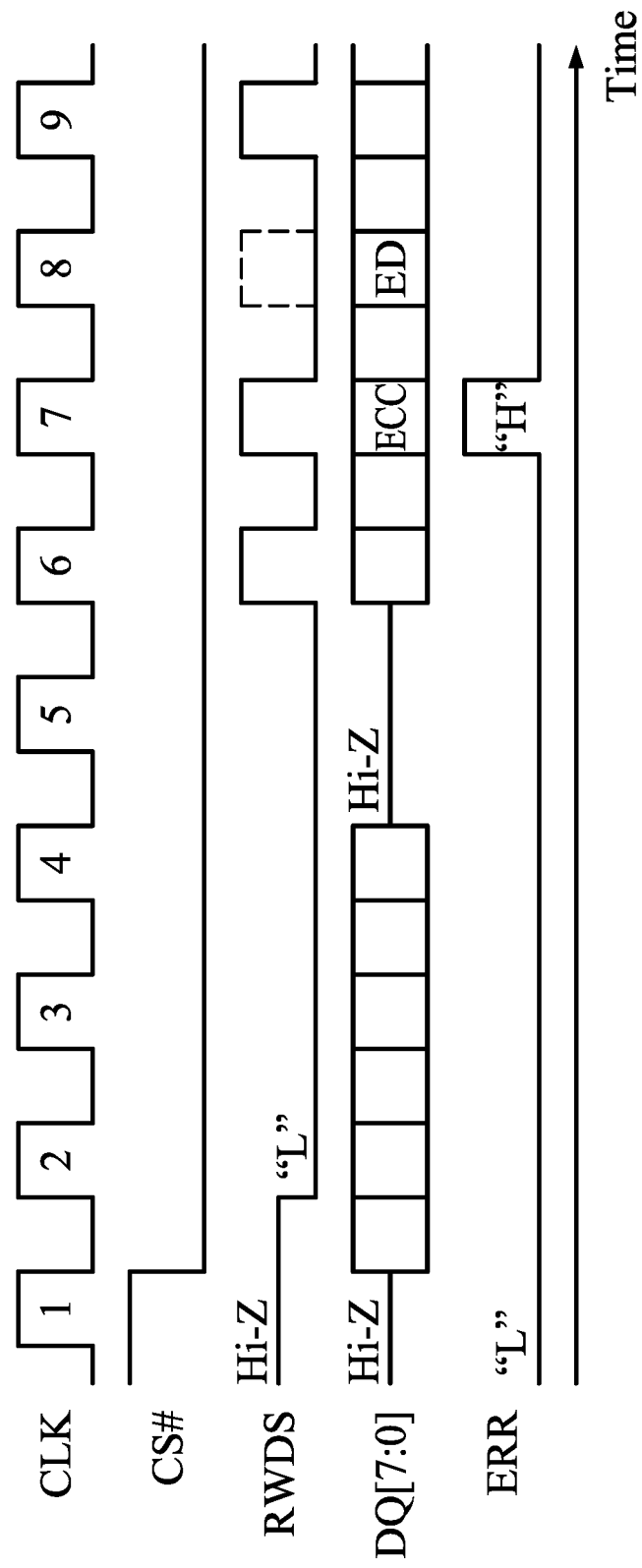
FIG. 7 shows a time chart of a read operation of the semiconductor memory device according to the second embodiment of the present invention.

FIG. 7 is a time chart showing an example of the read operation of the semiconductor memory device 10 of this embodiment. In this embodiment, at the rising edge of the seventh clock of the external clock signal CLK, the error detection circuit 16b detects that the data DQ[7:0] includes a correctable error bit (shown as ECC in the figure), and outputs the error detection signal ERR that becomes valid ("H"). After the error detection signal ERR becomes valid, when next bit of the correctable error bit of the data DQ[7:0](the example shown in the figure is the data output at the falling edge of the seventh clock of the external clock signal CLK) is output, the error detection signal ERR becomes invalid. It means that the semiconductor memory device 10 makes the error detection signal ERR valid only during the output of the corrected bit of the data DQ [7:0]. Besides, in the present embodiment, at the rising edge of the eighth clock of the external clock signal CLK, the error detection circuit 16b detects that the data DQ [7:0] includes an uncorrectable bit, and the second control circuit 16b stop the pulse of the data strobe signal RWDS. Here, the second control circuit 11b stops one of the pulse of the data strobe signal RWDS only since an uncorrectable bit is detected until the next bit of the data DQ[7:0](the example shown in the figure is data output at the falling edge of the eighth clock of the external clock signal CLK) is output.

As described above, according to the present embodiment, each bit of each data DQ [7:0](for example, each byte in a case of octal number) is output in response to the external clock signal CLK. According to the present embodiment, the uncorrectable bits in each of the output data DQ [7:0] can be identified. Furthermore, because it is possible to generate a pulse of the corresponding data strobe signal RWDS for bits other than the uncorrectable bits in data, when data containing uncorrectable bits is included in the data sequence, it can be avoided that correct bits following the uncorrectable bits becomes invalid (i.e., only the uncorrectable bits are not output, and the correct bits following the uncorrectable bits can be output).

In addition, according to the present embodiment, the correctable bits of each of the output data DQ [7:0] can be identified. Furthermore, since the error detection signal ERR becomes invalid during output, it can be easily determined that which data DQ [7:0] in the data sequence contains the correctable error bit.

Each of the embodiments described above is described to facilitate understanding of the present invention, and is not described to limit the present invention. Therefore, each element disclosed in each of the above embodiments is intended to include all design modifications and equivalents within the technical field of the present invention.

For example, in the first embodiment described above, the error detection signal ERR can be valid only while (data DQ[7:0]), including correctable error bits, is being output as in the second embodiment, or the pulse of the data strobe signal RWDS can be stopped only while data DQ[7:0], containing uncorrectable error bits, is being output.

In addition, each of the circuits 11 to 16, 100, and 200 in the semiconductor memory device 10 in each of the embodiments described above is an example of the configuration, and can be modified as appropriate, or various other configurations can be adopted.

What is claimed is:

1. A semiconductor memory device, comprising:
   a memory cell array, comprising a plurality of memory cells;
   an error detection and correction circuit, coupled to the memory cell array and configured to detect error bits in data output from the memory cell array, and making an error detection signal valid and correcting a correctable error bit to generate corrected data when the data includes the correctable error bit, wherein the error detection signal indicates that the correctable error bit is detected; and
   an input/output circuit, coupled to the error detection and correction circuit and configured to receive the data or the corrected data and the error detection signal from the error detection and correction circuit and to output a data strobe signal, the data or the corrected data and the error detection signal, wherein the data strobe signal includes a plurality of pulses in response to a clock signal when the data includes the correctable error bit, and the input/output circuit stops generating at least one of the pulses of the data strobe signal when the data includes an uncorrectable bit, wherein a bit number of the uncorrectable bit is larger than the bit number of the error bit that can be corrected by the error detection and correction circuit.

2. The semiconductor memory device as claimed in claim 1, wherein the error detection and correction circuit is configured to determine whether the data includes the uncorrectable bit, and when the data includes the uncorrectable bit, the error detection and correction circuit makes a detection signal valid wherein the detection signal indicates that the uncorrectable bit is detected, and the error detection and correction circuit outputs the detection signal to the input/output circuit.

3. The semiconductor memory device as claimed in claim 2, wherein the input/output circuit stops generating the at least one of the pulses of the data strobe signal only during a period that the detection signal is valid.

4. The semiconductor memory device as claimed in claim 2, wherein the input/output circuit stops the pulses of the data strobe signal until a read operation of a data sequence including the data is accomplished, when the data includes the uncorrectable bit.

5. The semiconductor memory device as claimed in claim 1, wherein the error detection and correction circuit is configured to make the error detection signal valid only during a period that the data including the correctable error bit is output.

6. The semiconductor memory device as claimed in claim 1, wherein the error detection and correction circuit is configured to make the error detection signal valid until a read operation of a data sequence including the data is accomplished, when the data includes the correctable error bit.

7. The semiconductor memory device as claimed in claim 2, wherein:
   the input/output circuit comprises a first control circuit and a second control circuit, and the second control circuit outputs the data strobe signal, the data or the corrected data and the error detection signal;
   the error detection and correction circuit includes an error detection circuit and an error correction circuit, wherein the error detection circuit is configured to generate the detection signal and the error detection signal, to output the error detection signal to the error correction circuit and the first control circuit, and to output the error detection signal to the error correction circuit and the second control circuit;
   wherein the first control circuit is configured to generate a pre data strobe signal corresponding to the data strobe signal according to the detection signal and the clock signal, and to output the pre data strobe signal to the second control circuit.

8. The semiconductor memory device as claimed in claim 7, wherein the second control circuit is configured to set at least one of the error detection signal, the data, and the data strobe signal to a high-impedance state when a semiconductor including the memory cell array, the error detection and correction circuit and the first control circuit is not selected.

9. The semiconductor memory device as claimed in claim 7, wherein the first control circuit comprises a data strobe driver, and the data strobe driver comprises:
   a logic gate circuit, configured to generate a toggled pulse in response to the clock signal.

10. The semiconductor memory device as claimed in claim 9, wherein the logic gate circuit comprises a P-Channel MOSFET and an N-Channel MOSFET in series between a high-voltage power supply and a low-voltage power supply, and the gates of the P-Channel MOSFET and the N-Channel MOSFET are coupled to the clock signal;
    wherein the data strobe driver further comprises:
    a switching circuit, coupled to a node between the P-Channel MOSFET and the N-Channel MOSFET, configured to receive the detection signal, and turned on to output the pulse from the logic gate circuit when the detection signal is invalid;
    wherein the switching circuit is in a cut-off state to stop outputting the pulse from the logic gate circuit when the detection signal becomes valid.

11. The semiconductor memory device as claimed in claim 10, wherein the data strobe driver further comprises:
    a latch circuit, coupled to an output of the switching circuit and configured to output the pulse from the switching circuit as the pre data strobe signal; and
    an inverter, configured to receive the detection signal, generate a logical inverse signal of the detection signal, and provide the logical inverse signal of the detection signal to a gate of the switching circuit;
    wherein the latch circuit retains a prior cycle of the pre data strobe signal which has been held in the latch circuit and stops the pulse of the pre data strobe signal, when the switching circuit is in the cut-off state.

12. The semiconductor memory device as claimed in claim 7, further comprising a command decoder, coupled to the second control circuit, which is configured to generate an activation signal according to a chip selection signal and output the activation signal to the second control circuit.

13. The semiconductor memory device as claimed in claim 12, wherein the second circuit comprises an off-chip driver, and the off-chip driver comprises:
   a pull-up control circuit, configured to generate a first gate control signal according to the activation signal and the data or the corrected data, the data strobe signal, or the error detection signal;
   a pull-up circuit, coupled between a high-voltage power supply and an output of the off-chip driver, coupled to an output of the pull-up control circuit, and controlled by the first gate control signal;
   a pull-down control circuit, configured to generate a second gate control signal according to a logical inverse signal of the activation signal and a logical inverse signal of the data or the corrected data, the data strobe signal, or the error detection signal; and
   a pull-down circuit, coupled between a low-voltage power supply and the output of the off-chip driver, coupled to an output of the pull-down control circuit, and controlled by the second gate control signal.

14. The semiconductor memory device as claimed in claim 13, wherein the pull-up circuit is in a turn-on state and the pull-down circuit is in a turn-off state, when the activation signal is at a high level and the data or the corrected data, the pre data strobe signal or the error detection signal is at the high level, to make the off-chip driver output the high level.

15. The semiconductor memory device as claimed in claim 13, wherein the pull-up circuit is in a turn-off state and the pull-down circuit is in a turn-on state, when the activation signal is at a high level and the data or the corrected data, the data strobe signal, or the error detection signal is a low level, to make the off-chip driver output the high level.

16. The semiconductor memory device as claimed in claim 13, wherein the pull-up control circuit comprises a first P-Channel MOSFET, a first N-Channel MOSFET, a second N-Channel MOSFET, and a second P-Channel MOSFET, wherein the first P-Channel MOSFET, the first N-Channel MOSFET, and the second N-Channel MOSFET is connected in series between the high-voltage power supply and the low-voltage power supply, the second P-Channel MOSFET is coupled between the high-voltage power and a connection node between the first P-Channel MOSFET and the first N-Channel MOSFET, the connection node between the first P-Channel MOSFET and the first N-Channel MOSFET is configured to output the first gate control signal, the data or the corrected data, the data strobe signal, or the error detection signal is input to the gates of the first P-Channel MOSFET and the second N-Channel MOSFET, and the activation signal is input to the gates of the first N-Channel MOSFET and the second P-Channel MOSFET.

17. The semiconductor memory device as claimed in claim 13, wherein the pull-down control circuit comprises a first P-Channel MOSFET, a second P-Channel MOSFET, a first N-Channel MOSFET, and a second N-Channel MOSFET, wherein the first P-Channel MOSFET, the second N-Channel MOSFET, and the first N-Channel MOSFET is connected in series between the high-voltage power supply and the low-voltage power, the second N-Channel MOSFET is coupled between the low-voltage power and a connection node between the second P-Channel MOSFET and the first N-Channel MOSFET, the connection node between the second P-Channel MOSFET and the first N-Channel MOSFET is configured to output the second gate control signal, the logical inverse signal of the data or the corrected data, the pre data strobe signal, or the error detection signal is input to the gates of the first P-Channel MOSFET and the second N-Channel MOSFET, and the logical inverse signal of the activation signal is input to the gates of the second P-Channel MOSFET and the first N-Channel MOSFET.

18. A method of reading a semiconductor memory device, comprising:
   examining whether an error exists in data output by a memory cell array of the semiconductor memory device;
   keeping an error detection signal invalid and generating a plurality of pulses in response to a clock signal while outputting the data, when it is examined that no error is in the data;
   making the error detection signal valid, when it is examined that a correctable error bit exists in the data;
   stopping a generation of at least one pulse of a data strobe signal, when it is examined that an uncorrectable bit exists in the data.

19. The method as claimed in claim 18, wherein the semiconductor memory device comprises a plurality of semiconductor chips, and the method further comprises setting at least one of the error detection signal, the data, and the data strobe signal output by an unselected semiconductor chip of the semiconductor chips to a high-impedance state.

20. The method as claimed in claim 18, wherein the step of stopping the generation of at least one pulse of the data strobe signal comprises:
   making a detection signal valid, wherein the detection signal indicates that the uncorrectable bit is detected;
   wherein the generation of at least one pulse of the data strobe signal is stopped only when the detection signal becomes valid.

* * * * *